United States Patent
Drabant et al.

(10) Patent No.: US 10,327,342 B2
(45) Date of Patent: *Jun. 18, 2019

(54) MODULAR FLEXIBLE CONVEX DISPLAY SYSTEM AND METHODS

(71) Applicant: Nanolumens Acquisition, Inc., Norcross, GA (US)

(72) Inventors: Stephen J. Drabant, Marietta, GA (US); Michael C. Fleming, Jr., Gainesville, GA (US)

(73) Assignee: Nanolumens Acquisition, Inc., Norcross, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/924,507

(22) Filed: Mar. 19, 2018

(65) Prior Publication Data

US 2018/0213657 A1    Jul. 26, 2018

Related U.S. Application Data

(63) Continuation of application No. 15/341,429, filed on Nov. 2, 2016, now Pat. No. 9,924,604.

(60) Provisional application No. 62/251,059, filed on Nov. 4, 2015.

(51) Int. Cl.
| | |
|---|---|
| *H05K 5/00* | (2006.01) |
| *H05K 5/02* | (2006.01) |
| *F21V 19/00* | (2006.01) |
| *G09F 13/04* | (2006.01) |
| *G09F 15/00* | (2006.01) |
| *G09F 9/302* | (2006.01) |

(52) U.S. Cl.
CPC .......... *H05K 5/0021* (2013.01); *F21V 19/00* (2013.01); *G09F 9/3023* (2013.01); *G09F 9/3026* (2013.01); *G09F 15/0031* (2013.01); *G09F 15/0037* (2013.01); *H05K 5/0017* (2013.01); *H05K 5/0256* (2013.01); *G09F 2013/0468* (2013.01); *G09F 2013/0481* (2013.01)

(58) Field of Classification Search
CPC .. G09F 9/3023; G09F 9/3026; G09F 15/0031; G09F 15/0037; G09F 2013/0468; G09F 2013/0481
See application file for complete search history.

(56) References Cited

U.S. PATENT DOCUMENTS

| | | |
|---|---|---|
| 5,747,928 A | 5/1998 | Shanks et al. |
| 6,332,690 B1 | 12/2001 | Murifushi |
| 6,819,045 B2 | 11/2004 | Okita et al. |
| 6,974,971 B2 | 12/2005 | Young |

(Continued)

*Primary Examiner* — Alexander K Garlen
(74) *Attorney, Agent, or Firm* — Theodore Heske, III

(57) ABSTRACT

Display modules have a plurality of light emitting elements arranged in a predetermined pattern and providing a highly uniform visual effect. Methods are provided to support a plurality of flexible display modules in an adjustable curved arrangement. Alignment and complementary alignment features enable the alignment of adjacent display modules and the creation of large displays from a plurality of aligned display modules. Features to couple to and retain a support frame are provided. Flexible and durable weather resistance features are provided. A system of modular support frames works cooperatively with the display modules, adapting to different mounting environments, and thereby providing large modular displays with desirable properties.

15 Claims, 12 Drawing Sheets

(56) References Cited

U.S. PATENT DOCUMENTS

| | | | |
|---|---|---|---|
| 7,242,398 | B2 | 7/2007 | Nathan et al. |
| 7,636,085 | B2 | 12/2009 | Yang |
| 7,710,370 | B2 | 5/2010 | Slikkerveer et al. |
| 7,714,801 | B2 | 5/2010 | Kimmel |
| 7,825,582 | B2 | 11/2010 | Furukawa et al. |
| 7,834,537 | B2 | 11/2010 | Kee et al. |
| 7,834,962 | B2 | 11/2010 | Satake et al. |
| 7,868,545 | B2 | 1/2011 | Hioki et al. |
| 7,977,170 | B2 | 7/2011 | Tredwell et al. |
| 8,023,060 | B2 | 9/2011 | Lin et al. |
| 8,096,068 | B2 | 1/2012 | Van Rens |
| 8,097,812 | B2 | 1/2012 | Wang et al. |
| 8,098,486 | B2 | 1/2012 | Hsiao |
| 8,228,667 | B2 | 7/2012 | Ma |
| 8,284,369 | B2 | 10/2012 | Chida et al. |
| 8,319,725 | B2 | 11/2012 | Okamoto et al. |
| 8,456,078 | B2 | 6/2013 | Hashimoto |
| 8,471,995 | B2 | 6/2013 | Tseng |
| 8,477,464 | B2 | 7/2013 | Visser et al. |
| 8,493,520 | B2 | 7/2013 | Gay et al. |
| 8,493,726 | B2 | 7/2013 | Visser et al. |
| 8,654,519 | B2 | 2/2014 | Visser |
| 8,780,039 | B2 | 7/2014 | Gay et al. |
| 8,816,977 | B2 | 8/2014 | Rothkopf et al. |
| 8,873,225 | B2 | 10/2014 | Huitema et al. |
| 8,963,895 | B2 | 2/2015 | Cope et al. |
| 8,982,545 | B2 | 3/2015 | Kim et al. |
| 9,013,367 | B2 | 4/2015 | Cope et al. |
| 9,058,755 | B2 | 6/2015 | Cope et al. |
| 9,071,809 | B2 | 6/2015 | Cope et al. |
| 9,117,384 | B2 | 8/2015 | Phillips et al. |
| 9,159,707 | B2 | 10/2015 | Cope |
| 9,176,535 | B2 | 11/2015 | Bohn et al. |
| 9,177,492 | B2 | 11/2015 | Wong |
| 9,279,573 | B1 | 3/2016 | Perez-Bravo et al. |
| 9,286,812 | B2 | 3/2016 | Bohn et al. |
| 9,326,620 | B1 | 5/2016 | Cross et al. |
| 9,330,589 | B2 | 5/2016 | Cope et al. |
| 9,335,793 | B2 | 5/2016 | Rothkopf |
| 9,372,508 | B2 | 6/2016 | Wang |
| 9,404,644 | B1 | 8/2016 | Perez-Bravo et al. |
| 9,435,518 | B2 | 9/2016 | Cope et al. |
| 9,445,044 | B1 | 9/2016 | Cope et al. |
| 9,459,656 | B2 | 10/2016 | Shai |
| 9,830,885 | B2 * | 11/2017 | Cross ................... G06F 3/1446 |
| 9,924,604 | B2 * | 3/2018 | Drabant ............... H05K 5/0021 |
| 2006/0098153 | A1 | 5/2006 | Slikkerveer et al. |
| 2006/0204675 | A1 | 9/2006 | Gao et al. |
| 2007/0241002 | A1 | 10/2007 | Wu et al. |
| 2008/0042940 | A1 | 2/2008 | Hasegawa |
| 2008/0218369 | A1 | 9/2008 | Krans et al. |
| 2008/0250686 | A1 | 10/2008 | Lee |
| 2009/0189917 | A1 | 7/2009 | Benko et al. |
| 2009/0309494 | A1 * | 12/2009 | Patterson ................. G09F 9/33 |
| | | | 313/512 |
| 2011/0134144 | A1 | 6/2011 | Moriwaki |
| 2011/0181494 | A1 | 7/2011 | Wong |
| 2012/0002360 | A1 | 1/2012 | Seo et al. |
| 2012/0092363 | A1 | 4/2012 | Kim et al. |
| 2012/0313862 | A1 | 12/2012 | Ko et al. |
| 2013/0100392 | A1 | 4/2013 | Fukushima |
| 2014/0251929 | A1 | 9/2014 | Fidler |
| 2014/0314999 | A1 | 10/2014 | Song |
| 2015/0092353 | A1 | 4/2015 | Baik |
| 2015/0145755 | A1 | 5/2015 | Yamazaki |

* cited by examiner

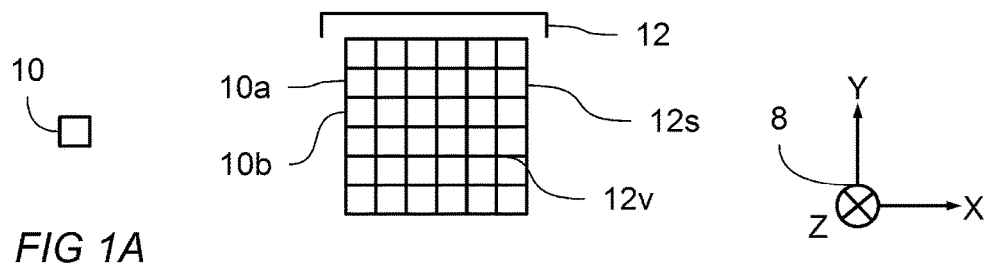
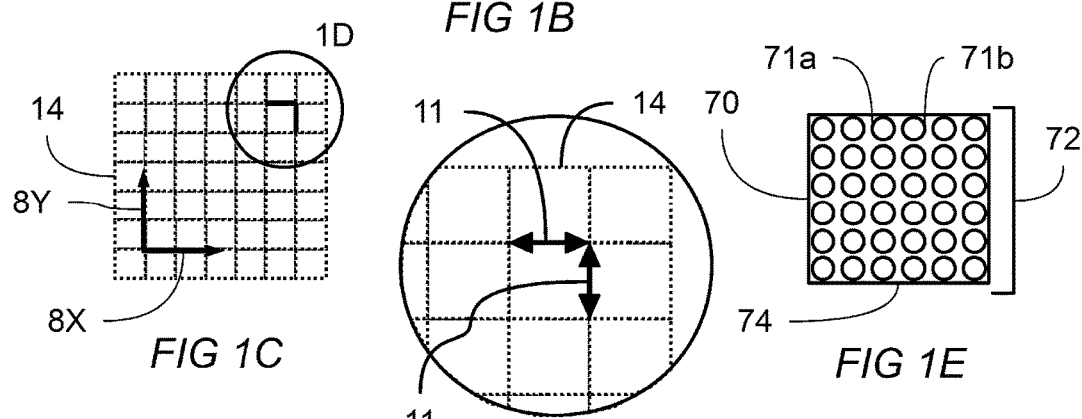
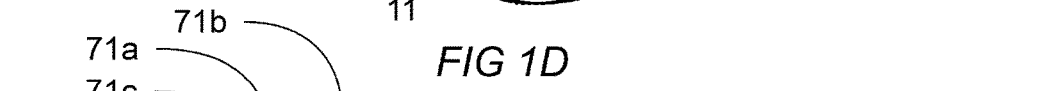
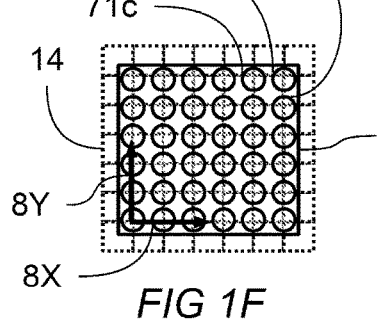
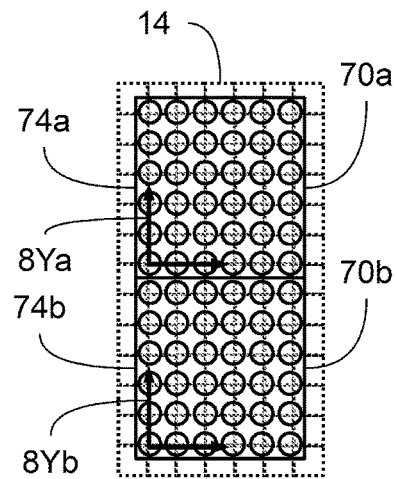
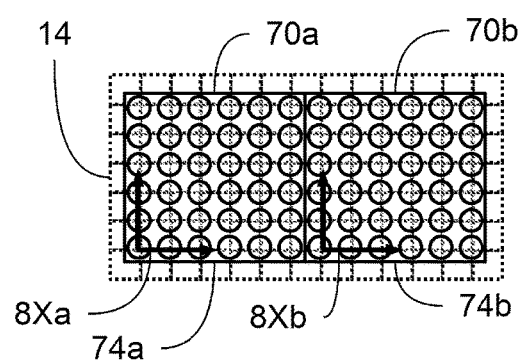

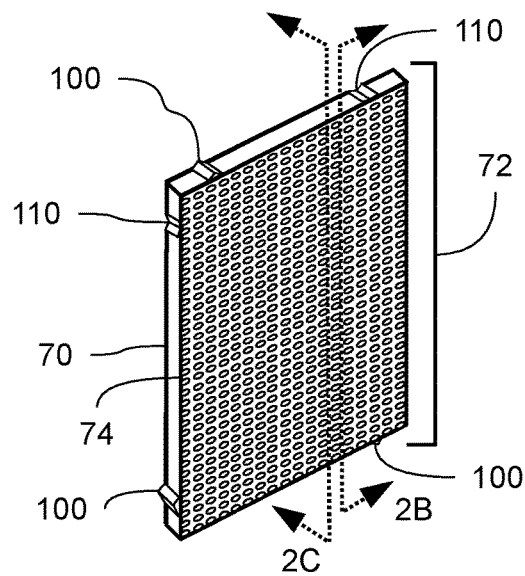
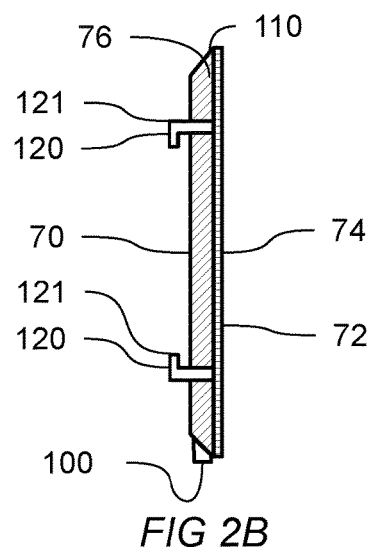
FIG 2A
FIG 2B
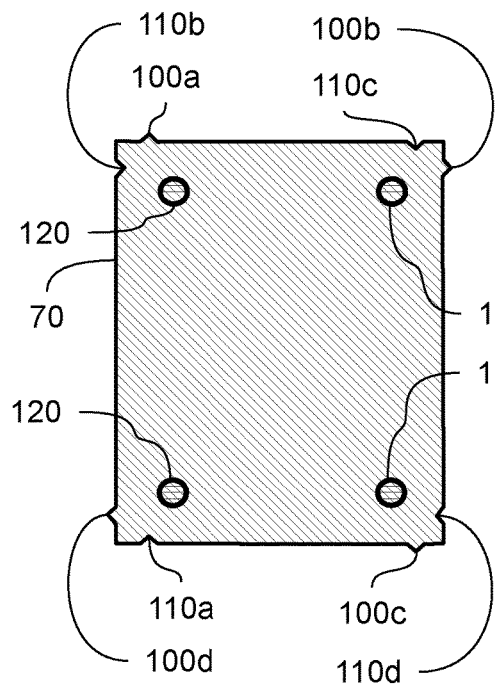
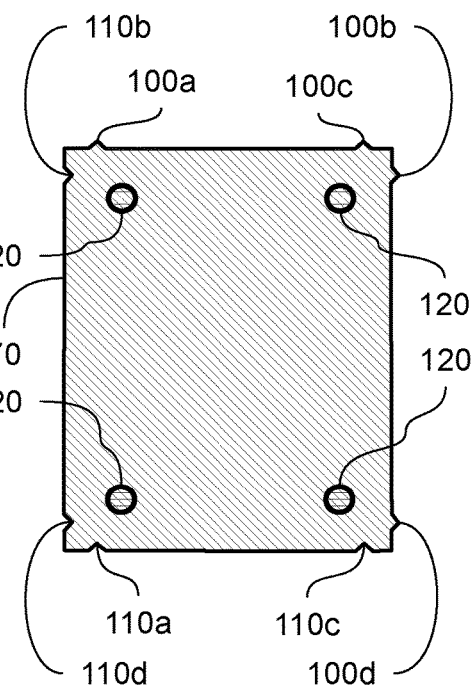
FIG 2C
FIG 2D

MODULAR FLEXIBLE CONVEX DISPLAY SYSTEM AND METHODS

CROSS REFERENCE TO RELATED APPLICATIONS

This non-provisional continuation utility application claims the benefit of U.S. application Ser. No. 15/341,429, filed on Nov. 2, 2016, entitled "Modular Flexible Convex Display System and Methods". Application Ser. No. 15/341,429 claimed the benefit of U.S. provisional Application No. 62/251,059, filed on Nov. 4, 2015, entitled "Modular Flexible Convex Display System and Methods". Application No. 62/251,059 and Ser. No. 15/341,429 are incorporated herein by reference.

STATEMENT REGARDING FEDERALLY SPONSORED RESEARCH OR DEVELOPMENT

Not Applicable.

DESCRIPTION OF ATTACHED APPENDIX

Not Applicable.

BACKGROUND

The sense of sight is utterly compelling to those human beings who possess it. The adage that a picture is worth a thousand words resonates with an appreciation of the profound importance of taking in visual information. The sense of sight is unique in allowing us to absorb so much information from our world so quickly. It is natural then that advertisers, entertainers, artists, and others all want to engage people with their own visual content for the purpose creating a desired response in their intended audience. A large scale visual display system is a particularly compelling way for people to experience the presentation of visual information and such systems are the focus of the present disclosure.

There are numerous features of a visual display system that contribute to its impact upon viewers including: size, brightness, contrast, color saturation, color depth, display refresh rate, resolution, pixel pitch, pixel pitch uniformity, and others.

There are numerous other features of a visual display system that are of interest to the owners and operators of such systems including: ease of installation, ease of service, reliability, ease of configuration, ease of maintenance, ease of operation, cost of the system, cost of installation, cost of operation, cost of service, and others.

Display systems having display planes configured into unusual shapes may be used to catch the interest of those persons within viewing distance. Unusual shapes may be created in two dimensions, providing a flat viewing plane that has an unconventional perimeter shape such as a circle, ellipse, etc. In addition, unusual shapes may be created in three dimensions such that a surface may be configured to present a viewing plane that sweeps through three dimensional space. As an example of a three dimensional viewing plane, consider the surface of a cylinder. A viewing plane that is coincident with at least a portion of the outside surface of a cylinder can be said to have a three dimensional viewing plane. An annular structure may also be used to create a three dimensional viewing plane. A surface that is formed on the inner surface of an annular structure can be used to form a concave three dimensional viewing plane. In similar manner, a surface that is formed on the outer surface of an annular structure can be used to form a convex three dimensional viewing plane.

Display systems in which the screen has an eye catching two or three dimensional structure present a number of difficult problems that are in need of solution. A typical mounting environment for a large display is on the outside structure of an existing building. Buildings are often situated so that the walls of the building are close to one or more real estate property boundaries. Installing a display system onto the outside of a building that is already constructed runs the risk of straying into the air rights of an adjacent real estate parcel because of the added thickness of the display system. If the display system is too thick the owner of the system may be forced to either remove the system or obtain the air rights in the adjacent real estate lot at added expense.

Another difficult problem in need of solution relates to the mounting of a large display on non-planar structural features of a building. Particularly challenging non-planar structural features found on buildings are support columns and support beams. Typical support columns and beams have circular or rectangular cross sections and bear high structural loads. Any physical penetration of a support column or beam into the cross section of that structural feature carries with it the risk of compromising the structural integrity and load bearing capacity of the support structure. Displays that are mounted to one or more support columns or beams must be mounted in such a way as to reduce or eliminate penetration of the load bearing portion of that structural feature.

Yet another difficult problem in need of solution is that the outer envelop of most load bearing structures is neither designed nor constructed to provide a smooth, even mounting surface, having no discontinuities. What is needed is a mounting system that is able to accommodate or otherwise smooth out the unevenness of the underlying structure so that the viewing plane of the large display shows no discontinuities and no unevenness.

In consideration of the foregoing points, it is clear that embodiments of the present disclosure confer numerous advantages and are therefore highly desirable.

SUMMARY

The present disclosure is directed to modular flexible convex display systems, display modules, systems for mounting and servicing modular display systems, and methods for making, using, and servicing the modules and systems described.

Display systems of the present disclosure comprise a plurality of display modules assembled onto a support frame or assembly of support frames to make a large, unified, visual display. Each display module in the system comprises a plurality of light emitting elements coupled to a flexible substrate and arranged in a predetermined pattern with respect to a display plane. Each display module is shaped so that it may abut one or more other display modules without introducing gaps or overlaps between adjacent display modules. The display systems disclosed create a highly uniform visual effect by creating highly uniform spacing between light emitting elements, both within a single display module and across a plurality of display modules when the plurality are assembled into a large, unified, visual display. The present disclosure provides complementary alignment features that cooperatively enforce alignment between adjacent display modules thereby maintaining highly uniform spacing of light emitting elements throughout the plurality of assembled display modules.

Additional features of the present disclosure address the needs of mounting, assembling, and servicing of large visual displays that are created from one or more display modules. One typical installation environment for a large display system is a rigid architectural structure like a beam or column that supports structural loads. Another typical installation environment may suspend a large display from a top mounted structure so that the display may appear to float. Other typical installation environments adapt the curvature of the viewing plane to convex, concave, and multiple curvature containing shapes that each have their own appeal and challenges. A system of modular support frames according to the present disclosure may be assembled thereby providing a substructure for attaching display modules to present a curved viewing plane. In other embodiments of the present disclosure, a system of modular support frames may be assembled thereby providing a substructure for attaching display modules to present a non-flat viewing plane having convex, concave, or multiple convex and concave curvatures. One or more display modules may be individually mounted and unmounted from the system of support frames without substantially disturbing adjacent display modules.

Each display module provides a plurality of light emitting elements arranged on a display plane. After assembly, the plurality of display modules collectively create a viewing plane that may be viewed by the viewing public. In such an installation, the vast majority of the display system is located in the space between the viewing plane and the mounting surface. Installations of this configuration may be difficult, or impossible, to service or install from behind the viewing plane because the wall, curved wall, column, or beam that provides the mounting surface are rigid, contiguous structures that do not permit such access. The present disclosure provides support frame systems and display modules having cooperative mounting features allowing display modules to be installed and serviced from the viewing side of the viewing plane.

To make the description more precise, it is useful to consider a three dimensional Cartesian coordinate system consisting of mutually orthogonal axes x, y, and z. The x-y plane is identified as being parallel to the viewing plane, and the z axis is in a direction perpendicular to the viewing plane. In this coordinate system it is the z axis that allows a viewer of the display to be in front of the viewing plane while the mounting surface and support frame system are behind the viewing plane. The support frame system provides a means of securely and removeably coupling a plurality of display modules to a mounting surface while allowing the complementary alignment features of adjacent display modules to cooperatively create a uniform alignment of the plurality of light emitting elements on each of the plurality of display modules.

Features of the disclosure allow display modules to be installed, serviced, and removed from the front of the viewing plane. A display module may allow engagement onto a portion of the support frame or planar support body while the orientation of the display module is tilted with respect to the viewing plane. The progressive engagement of releasable frame couplers with the support frame or planar support body permits the display module to move about as the display plane of the display module is tilted both toward and away from the viewing plane. By flexing, rotating, and/or translating the display module, one or more complementary pairs of alignment features on adjacent display modules may be operatively engaged. When complementary alignment features on adjacent display modules are operatively engaged, the display planes of adjacent display modules are aligned and may be made substantially co-planar in the region where two adjacent display modules abut. In some embodiments a frame retention means may be operated from the front of the display into a retaining position, thus securing the display module to the support frame or planar support body while urging the one or more pairs of complementary alignment features to maintain a predetermined and uniform pitch distance between adjacent display modules. In some embodiments, magnetic means may be used to couple display modules to the support frame system. In some embodiments, both magnetic and non-magnetic retention means may be used to couple display modules to the support frame or planar support body. The plurality of display modules installed onto the support frame system collectively create a viewing plane having a highly uniform visual effect by maintaining a pitch distance between adjacent display modules that is substantially equal to the pitch distance within an individual display module.

Features of the disclosure describe systems of modular support frames and display modules for creating a convex viewing plane that partially or completely encircles an axial reference line or a support structure such as a beam or column, and presents a viewing plane visible from outside of the display system. A common axial reference line may be defined as lying at or about the center of a support structure that will be encompassed by the display system. One or more radial reference lines may be defined extending from said axial reference line radially outward. A plurality of modular support frames may be used to encircle a support structure or otherwise surround a structure to enclose said common axial reference line. A plurality of modular support frames may be coupled to other components, the collective being referred to as the support frame system. Each modular support frame may have top and bottom panels joined to each of left and right side panels, while each of top, bottom, left, and right panels are joined to a back panel. Left and right panels are thin elongate panels disposed to lay along radial lines emanating from a common axial reference line that is substantially parallel to both left and right panels. Of the panels comprising the modular support frame, the back panel is closest to said common axial reference line. Accordingly, top and bottom panels are shaped so that left and right panels are not parallel to each other. Top and bottom panels are disposed to be substantially perpendicular to said common axial reference line, top and bottom panels being about parallel to each other. Each modular support frame may have one or more equipment mounting features that are operative to securely mount equipment needed by the system of display modules such as power supply, surge protection, analog signal conditioning and\or distribution and digital signal conditioning and\or distribution.

A first modular support frame may be coupled to a substantially similar or identical second modular support frame such that the left side panel of the first modular support frame is coupled to and abuts the right side panel of the second modular support frame. A plurality of substantially similar or identical modular support frames may thereby be assembled into a support frame system that partially or completely wraps around said common axial reference line. Each modular support frame may include features to facilitate coupling to one or more adjacent modular support frames, those features operating by means including but not limited to: screwing, bolting, clipping, clamping, welding, brazing, and magnetic attraction. Display modules may then be installed onto the constructed support frame system and thus create a viewing plane that wraps around said common axial reference line.

In some embodiments it is desirable to obtain a viewing plane that wraps around in such a way as to create a continuous or seamless viewing plane that has no apparent beginning or end, analogous to the continuous surface around the geometric form of a cylinder. Obtaining an apparently continuous or seamless viewing plane requires precise positioning and spacing of display modules. One or more radially adjustable couplers may be coupled between one or more modular support frames and one or more display modules to provide the fine adjustment necessary to make sure that the viewing plane can be created with no gaps and no overlaps between adjacent display modules. The principle of operation of the radially adjustable coupler is that, as the radial distance is adjusted radially inward or outward, a related adjustment in circumference is thereby created. When the circumference is adjusted to encompass a substantially integer number of display modules there will be no visible overlaps or gaps between adjacent display modules comprising the viewing plane.

In some embodiments a thin planar support body may be coupled to a plurality of assembled modular support frames to provide a display mounting face. The thin planar support body may be caused to curve gracefully around the outer dimensions of the plurality of assembled modular support frames while being coupled to the same said modular support frames. The outward surface of the thin planar support body presents a display mounting face suitable for tiling a plurality of display modules. A plurality of display modules may be mounted to the display mounting face to collectively create a viewing plane with no visible gaps or overlaps. Display modules may be releasably coupled to the display mounting face by mechanical, magnetic, or a combination of means. The thin planar support body may include features to facilitate the coupling of display modules to the thin planar support body, those features operating by means including but not limited to: screwing, bolting, clipping, clamping, and magnetic attraction.

In other embodiments, the thin planar support body may be coupled to a plurality of radially adjustable couplers which are then coupled to a plurality of assembled modular support frames. The radially adjustable couplers may be individually adjusted radially inward and outward so as to provide adjustability in the circumference of the planar support body as it partially or completely encircles the plurality of assembled modular support frames. The thin planar support body may have a plurality of apertures which may facilitate attachment of display modules and provide easy access to an interior portion of the modular support frames. The thin planar support body may have edge features designed to allow two opposing edges to join in an adjustable lap joint, thereby creating a nearly seamless joint.

Additional features of the disclosure provide for flexible display module features and constructions enabling the construction of large systems of flexible display modules having desirable viewing properties, desirable flexibility, and desirable weather and environmental resistance properties.

BRIEF DESCRIPTION OF THE DRAWINGS

These and other features, aspects, and advantages of the present invention will become better understood with regard to the following description, appended claims, and accompanying drawings where:

FIG. 1A shows a square consistent with a regular four sided polygon.

FIG. 1B shows a square tiling of a two dimensional plane.

FIG. 1C shows coordinate axis defined on square tiling. Enlarged view 1D is indicated FIG. 1D shows an enlarged view of the indicated region of FIG. 1C showing uniform row and column pitch distance.

FIG. 1E shows a plan view of a display module having a plurality of light emitting elements coordinate axis defined on square tiling.

FIG. 1F shows the display module of FIG. 1E overlaid with the predetermined pattern of square tiling and coordinate axes.

FIG. 1G shows a plan view of two display modules aligned along their y-axis.

FIG. 1H shows a plan view of two display modules aligned along their x-axis.

FIG. 2A shows a perspective view of a display module. Cross sections 2B and 2C are indicated.

FIG. 2B shows a cross sectional schematic view of the display module of FIG. 2A.

FIG. 2C shows another cross sectional schematic view of the display module of FIG. 2A.

FIG. 2D shows a cross sectional schematic view of another embodiment of a display module having a different configuration of alignment and complementary alignment features.

LIST OF REFERENCE NUMBERS APPEARING IN THE FIGURES

Figure 2E:
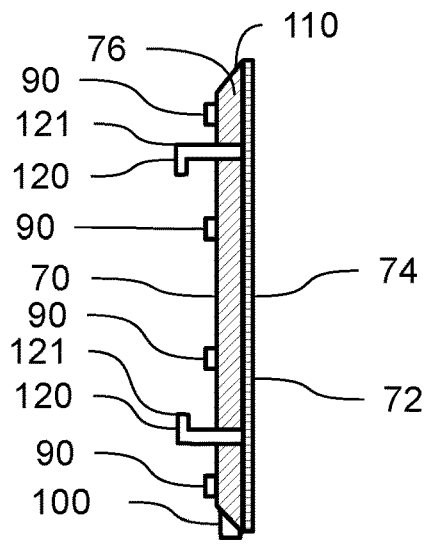
FIG. 2E shows a cross sectional schematic view, in the same direction as FIG. 2B, of another embodiment of a display module having magnetic couplers.

2—modular flexible convex display system
8—coordinate system showing x-axis, y-axis, and z-axis
8X—x-axis
8Y—y-axis
8Z—z-axis
10—square tile, which is a regular 4 sided polygon
10a, 10b, etc.—first square, second square, etc.
11—pitch distance
12—square tiling of the plane
12v—representative vertex of the square tiling
12s—representative side of the square tiling
14—predetermined pattern corresponding to a tiling of the plane
20—structural member
22—axial reference line
24—radial reference line
24a, 24b, etc.—first, second, etc. radial reference line
30—tension member
32—compression member
38—frame mount
40—modular support frame
41—support direction
42—support frame aperture
42a, 42b, etc.—first, second, etc. support frame aperture
43—radially adjustable coupler
44—planar support body
45—planar support body lap joint
46—display mounting face
50—support frame back panel
52—support frame right side panel
53—support frame left side panel
54—support frame top panel
55—support frame bottom panel
70—flexible display module
70a, 70b, 70c etc.—first, second, third, etc. flexible display module
71—light emitting element
71a, 71b, etc.—first, second, etc. light emitting element
72—plurality of light emitting elements
74—display plane
75—display plane disposed at a first angle with respect to the viewing plane
76—flexible substrate
80—viewing plane
82—environmental barrier coating
84—semi rigid front mask
90—magnetic coupler
92—coupler alignment frame
100—alignment feature
100a, 100b, 100c, etc.—first, second, third, etc. alignment feature
110—complementary alignment feature
110a, 110b, 110c, etc.—first, second, third, etc. complementary alignment feature
120—frame retention means
121—frame retention means in a non-retaining position
123—frame retention means in a retaining position

DESCRIPTION

Tesselation of a planar surface is the tiling of the plane using one or more geometric shapes, called tiles, creating no gaps and no overlaps. A periodic tiling has a repeated geometric pattern. A regular tiling is a tiling in which all tiles are regular polygons having the same size and shape. Square, triangular, and hexagonal tilings are each an example of a regular, periodic tiling that can achieve a tesselation of a planar surface without gaps or overlaps. Tilings are of special interest in the construction of modular displays because their properties enable the construction of large displays with desirable properties. Assembling a plurality of smaller display modules in which each display module is configured to have a size, shape, and orientation corresponding to a predetermined tiling may produce a large display having no gaps and no overlaps between adjacent display modules.

Within a single display module, a plurality of light emitting elements may be arranged in a predetermined pattern derived from an appropriately configured tiling. A planar tiling of regular polygons consists of edges and vertexes. The set of vertexes of a regular polygon tiling can be seen to create a pattern with a high degree of regularity. A highly uniform visual effect may be produced by placing a light emitting element at or about each of the vertexes of a regular polygon tiling.

In creating a uniform visual effect, it is useful to consider a property called pitch distance, which is the distance between any light emitting element and its closest adjacent light emitting elements. It can be seen that a highly uniform visual effect is produced by maintaining a highly uniform pitch throughout a single display module and across a plurality of adjacent display modules. Preferred embodiments of the present disclosure use light emitting elements located at or about the vertexes of a regular polygon tiling. A regular square tiling is one such preferred tiling, producing a uniform visual effect by providing uniform spacing between both rows and columns of light emitting elements. The spacing between adjacent rows and between adjacent columns of a regular square tiling may be referred to as the pitch of that pattern. In such a square tiling, it can be seen that any light emitting element will have at least two closest adjacent neighboring elements that are spaced apart from each other by a distance close to or substantially equal to the pitch distance.

In addition to uniform pitch within a single display module, the spacing between display modules can be controlled so that uniform pitch of light emitting elements is maintained across a plurality of assembled display modules. A preferred embodiment is to provide a display module with a perimeter region, of a predetermined width, that contains no light emitting elements. The preferred width of the perimeter region is less than or about equal to one half of the pitch distance, when measured inward and along the edges of the regular polygon tiling defining the location of the plurality of the light emitting elements. When two display modules are assembled adjacent to one another, each module may provide a perimeter region width of about one half of the pitch, which cumulatively creates a pattern of uniform pitch spanning both modules. A plurality of display modules may thereby be assembled to create uniform pitch spanning the plurality of display modules.

A single display module may comprise a plurality of light emitting elements coupled to a flexible substrate, and arranged in a predetermined pattern corresponding to the vertexes of a regular polygon tiling. The display module has a perimeter. A plurality of display modules may be assembled such that a portion of the perimeter of each display module abuts a portion of the the perimeter of at least one other display module, each module positioned to maintain uniform pitch spacing across the plurality of display modules.

A display system according to the present disclosure may be constructed by assembling a plurality of display modules onto a support frame, the support frame having been previously constructed.

Turning now to FIG. 1A, shown is a regular four sided polygon, also called a square 10, consistent with the square tiling 12 of the two dimensional plane shown in FIG. 1B. A coordinate system 8 is indicated so as to make discussion of geometry features of the present disclosure more clear. Coordinate system 8 applies to all figures FIG. 1A-FIG. 1H. Square tiling 12 is comprised of a plurality of square tiles, of which first square 10a and second square 10b are typical, arranged so that no gaps and no overlaps are produced. When arranged into the predetermined pattern shown in FIG. 1B, the square tiling 12 can be seen to create a plurality of vertex 12v and a plurality of side 12s, in which every vertex 12v is separated a distance of about 12s from each of its closest neighboring vertexes.

FIG. 1C shows predetermined pattern corresponding to a tiling of the plane 14 according to a square tiling. Overlaid onto the predetermined pattern corresponding to a tiling of the plane 14 are x-axis 8X and y-axis 8Y, showing that a coordinate system can be overlaid onto the the predetermined pattern to facilitate clear disclosure of the location and alignment of other features to be described. The enlarged section, denoted FIG. 1D, shows that the square tiling of the plane gives rise to a highly uniform spacing of vertexes, which can be characterized as pitch distance 11. Pitch distance 11 corresponding to the predetermined pattern 14 gives rise to uniform spacing between rows and columns when that predetermined pattern is based upon a square tiling. It can be seen that row spacing and column spacing are both about equal to the pitch distance 11.

Turning now to FIG. 1E, shown is a flexible display module 70 having a plurality of light emitting elements 72, of which first light emitting element 71a and second light emitting element 71b are individual members of the plurality. Plurality of light emitting elements 72 is shown arranged according to a predetermined pattern so as to create a highly uniform visual effect upon display plane 74. FIG. 1F shows how predetermined pattern 14 according to a square tiling of the plane may be used to position individual light emitting elements 71a, 71b, and 71c according to the location of the vertexes of said predetermined pattern 14. Superimposed upon the plurality of light emitting elements are x-axis 8X and y-axis 8Y. The flexible display module 70 of FIG. 1F comprises a plurality of light emitting elements, each of which may be a single light emitting device or multiple light emitting devices. A preferred light emitting element combines red, blue, and green light emitting devices within one light emitting element so as to provide full color spectrum display. Monochrome and other combinations of devices may be used still within the spirit and scope of this disclosure. The display modules of FIG. 1E and FIG. 1F each have a region adjacent to their perimeter that is free from light emitting elements. This enables close spacing of adjacent modules as will be seen now.

FIG. 1G shows a first flexible display module 70a adjacent to a second flexible display module 70b and disposed so that their display planes 74a and 74b abut and their respective y-axes 8Ya and 8Yb are substantially aligned, thereby creating a highly uniform visual effect that spans the combined display modules. A pitch distance can be defined between adjacent light emitting elements between adjacent display modules that is substantially equal to the pitch distance between adjacent light emitting elements within a single display module.

FIG. 1H shows a first flexible display module 70a adjacent to a second flexible display module 70b and disposed so that their respective display planes 74a and 74b abut and their respective x-axes 8Xa and 8Xb are substantially aligned, thereby creating a highly uniform visual effect that spans the combined display modules. A pitch distance can be defined between adjacent light emitting elements between adjacent display modules that is substantially equal to the pitch distance between adjacent light emitting elements within a single display module. When abutted and aligned in the foregoing manner, two adjacent modules may be combined such that their combined plurality of light emitting elements are disposed upon a single predetermined pattern 14 defining a regular tiling of the plane.

FIG. 1G and FIG. 1H make it clear that a large display may be constructed from display modules designed according to the teaching of FIG. 1A-FIG. 1H. Such a large display will tile the two dimensional plane without gaps and without overlaps and produce a highly uniform visual effect. Any number of display modules may be combined in both x and y directions to make a large display that is substantially free from visual aberrations.

FIG. 2A shows a perspective view of a flexible display module 70 having a plurality of light emitting elements 72 coupled to a flexible substrate 76 and disposed in a predetermined pattern to create a display plane 74. Also coupled to flexible substrate 76 are alignment feature 100 and complementary alignment feature 110, which are both designed to operatively engage features on adjacent display modules so as to cooperatively establish and maintain alignment and registration with adjacent display modules, thereby creating a highly uniform visual effect. Alignment feature 100 is designed so that it may operatively engage a complementary alignment feature on an adjacent display module and thereby constrain the relative position of the two adjacent display modules. Likewise, complementary alignment feature 110 is designed so that it may operatively engage an alignment feature on an adjacent display module and thereby constrain the relative position of the two adjacent display modules. In preferred embodiments, a flexible display module may have a plurality of alignment and complementary alignment features. An x-axis may be defined to lie in the display plane. A y-axis, non-parallel to said x-axis, may also be defined to lie in the display plane. Engagement of an alignment feature with a complementary alignment feature on an adjacent module may create: substantial alignment of the x-axes of the display planes of the adjacent modules, substantial alignment of the y-axes of the display planes of the adjacent modules, substantial alignment of both x-axes and y-axes of the two modules, substantial co-planarity of the display planes of the adjacent modules, substantial alignment of either x-axes or y-axes along with the substantial co-planarity of the display planes of the adjacent modules. Substantial alignment in the foregoing description means alignment sufficient to avoid perceivable visual aberration between adjacent display modules. Substantial co-planarity in the foregoing description means alignment sufficient to avoid perceivable visual aberration between adjacent display modules.

Shown now in FIG. 2B is a cross sectional view as indicated from FIG. 2A. The cross sectional view shows additional features of flexible display module 70 not visible in FIG. 2A due to its orientation. Flexible display module 70 additionally comprises: a frame retention means 120 coupled to flexible substrate 76 and adapted to engage with a support frame member. The support frame member is not shown in this figure. Frame retention means 120 is shown in the figure in a non-retaining position 121. Frame retention means is operative to move between said non-retaining position 121 and a retaining position for securing the display module to a support frame member, further characterized in that frame retention means 120 may be actuated by a person from the display plane side of the display module, or by a person on the side of the flexible display module obverse to the display plane. In preferred embodiments the frame retention means may be actuated by means of a turning motion, and thereby progressively engage a clamping force between the support frame and flexible display module 70. The clamping force may be provided by a spring member that securely, but not rigidly, attaches the display module to the support frame member. Also shown in FIG. 2B are alignment feature 100 and complementary alignment feature 110 which are operative for engaging, respectively, a complementary alignment feature and an alignment feature of adjacent display modules. In preferred embodiments adjacent display modules may be identical to flexible display module 70. It is noted that elements appearing in the drawings may not be drawn to scale and that this is done in the interest of clarity of the disclosure.

Shown in FIG. 2C is a cross sectional view as indicated from FIG. 2A. In this figure the complementary mechanical design of alignment feature 100 and complementary alignment feature 110 can be seen. A plurality of alignment and complementary alignment features are shown. Also shown is a circular cross section of frame retention means 120, which facilitates actuation of frame retention means 120 by means of rotation. Multiple pairs of alignment-complementary alignment features are shown in FIG. 2C. When a plurality of identical flexible display modules are tiled into a display system: first alignment feature 100a may operatively engage a first complementary alignment features 110a of an adjacent flexible display module; second alignment feature 100b may operatively engage a second complementary alignment features 110b of an adjacent flexible display module; third alignment feature 100c may operatively engage a third complementary alignment features 110c of an adjacent flexible display module; and, fourth alignment feature 100d may operatively engage a fourth complementary alignment feature 110d of an adjacent flexible display module. Operative engagement of alignment features with complementary alignment features creates substantial alignment and substantial co-planarity among and between a plurality of adjacent flexible display modules. Substantial alignment in the foregoing description means alignment sufficient to avoid perceivable visual aberration between adjacent display modules. Substantial co-planarity in the foregoing description means a degree of co-planarity that is sufficient to avoid perceivable visual aberration between adjacent display modules.

FIG. 2D shows a cross sectional view similar to FIG. 2C, but of another embodiment of a flexible display module 70 comprising a different configuration of alignment and complementary alignment features. The embodiment of FIG. 2D shows a rectangular flexible display module 70 in which the combination of alignment features and complementary alignment features is different for each side of the display module. According to the embodiment of FIG. 2D, tiling a display system with adjacent flexible display modules requires that the adjacent modules must be fit together in a specific way. Thus the system of flexible display modules may be fit together in a way that enforces a specific orientation of each flexible display module so that, with respect to adjacent display modules: first alignment feature 100a may operatively engage a first complementary alignment feature 110a of an adjacent flexible display module; second alignment feature 100b may operatively engage a second complementary alignment features 110b of an adjacent flexible display module; third alignment feature 100c may operatively engage a third complementary alignment features 110c of an adjacent flexible display module; and, fourth alignment feature 100d may operatively engage a fourth complementary alignment feature 110d of an adjacent flexible display module.

FIG. 2E is a cross sectional view of another embodiment of flexible display module 70, shown from a viewpoint similar to FIG. 2B. Flexible display module 70 comprises a plurality of light emitting elements 72 coupled to a flexible substrate 76 and disposed in a predetermined pattern to create a display plane 74. Flexible display module 70 additionally comprises: one or more magnetic couplers 90 coupled to flexible substrate 76 and adapted to engage with a ferromagnetic support frame. The support frame is not shown in this figure. Frame retention means 120 is shown in the figure in a non-retaining position 121. Frame retention means 120 is operative to move between said non-retaining position 121 and a retaining position for securing the display module to a support frame, further characterized in that frame retention means 120 may be actuated by a person from the display plane side of the display module, or by a person on the side of the flexible display module obverse to the display plane. In preferred embodiments the frame retention means may be actuated by means of a turning motion, and thereby progressively engage a clamping force between the support frame and flexible display module 70. The clamping force may be provided by a spring member that securely, but not rigidly, couples the display module to the support frame. Also shown in FIG. 2E are alignment feature 100 and complementary alignment feature 110 which are operative for engaging, respectively, a complementary alignment feature and an alignment feature of adjacent display modules. In preferred embodiments adjacent display modules may be identical to flexible display module 70.

Figure 2F:
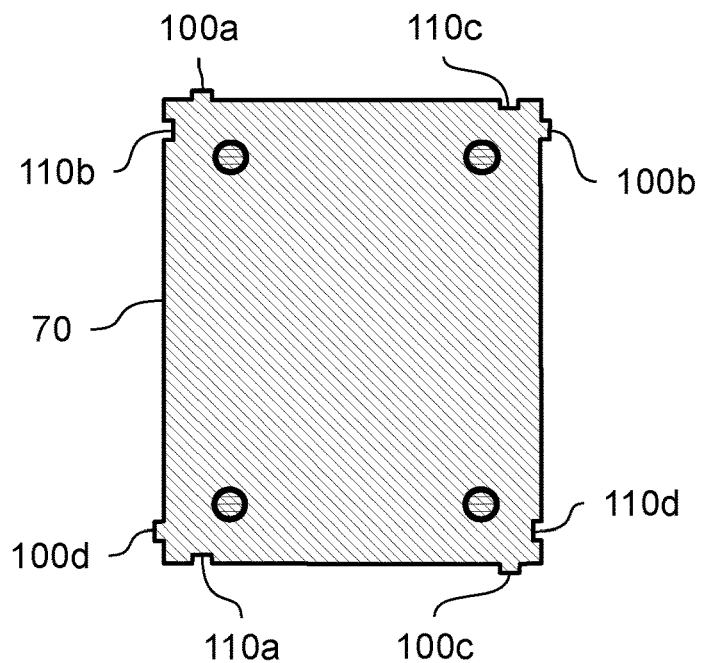
FIG. 2F shows a cross sectional schematic view, in the same direction as FIG. 2C, of another embodiment of a display module having a different configuration of alignment and complementary alignment features.

It is clear that a variety of complementary physical shapes can be used to achieve the alignment and complementary alignment functionality required. FIG. 2F is a cross sectional view of another embodiment of flexible display module 70, shown from a viewpoint similar to FIG. 2C. The embodiment in the figure shows: a first alignment feature 100a operative to engage a first complementary alignment feature 110a on an adjacent flexible display module of identical design; a second alignment feature 100b operative to engage a second complementary alignment feature 110b on an adjacent flexible display module of identical design; a third alignment feature 100c operative to engage a third complementary alignment feature 110c on an adjacent flexible display module of identical design; and, a fourth alignment feature 100d operative to engage a fourth complementary alignment feature 110d on an adjacent flexible display module of identical design.

Figure 3A:
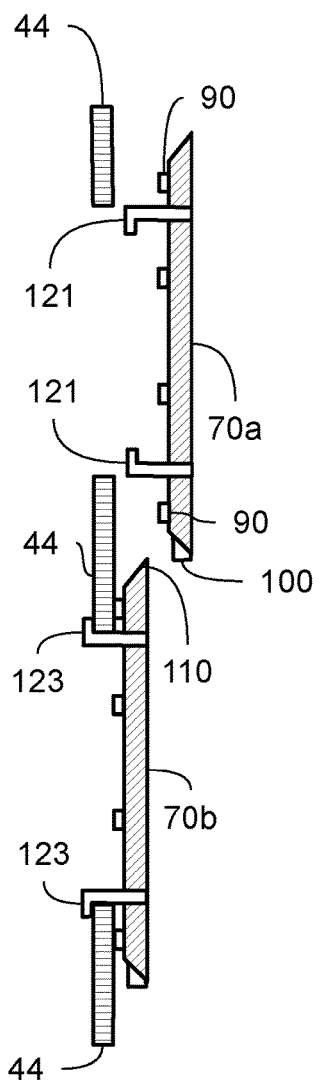
FIG. 3A-FIG. 3C show a cross sectional schematic view of an embodiment according to the present disclosure in which a display module may be become operatively engaged with the alignment features of more than one adjacent display module as the display module is installed on a support frame. Installation and removal of display modules from support frame may be accomplished from the front side or the back side of the display.
Figure 3B:
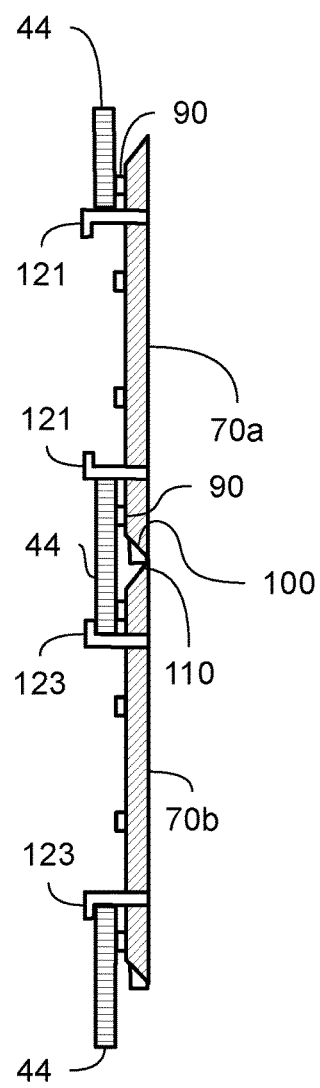
Figure 3C:
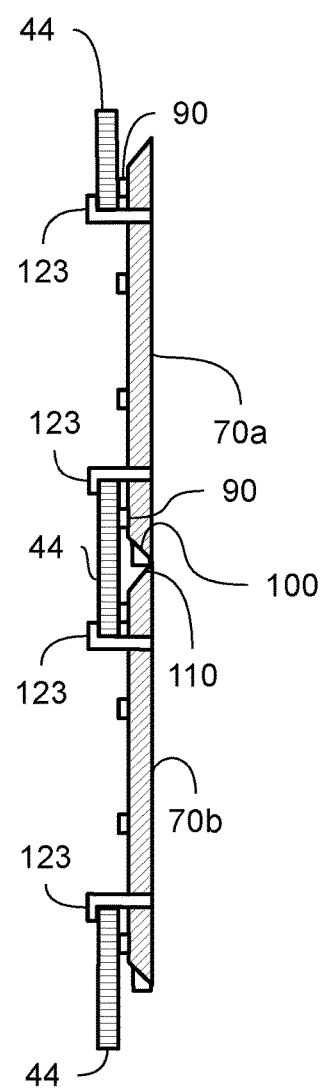

Turning now to FIG. 3A, FIG. 3B, and FIG. 3C, shown are cross sectional schematic views pointing out various beneficial aspects of flexible display module 70, and in particular, how a first flexible display module 70a may be engaged with a planar support body 44 and how it may engage with an adjacent second flexible display module 70b, wherein both actions may be completed by a person from the display side of the display module or from the back, or obverse, side of the display module. FIG. 3A shows first flexible display module 70a comprising: alignment feature 100 and complementary alignment feature 110, a plurality of magnetic couplers 90 coupled to the display module and disposed to engage at least a portion of the planar support body that is ferromagnetic, and frame retention means in a non-retaining position 121. Second flexible display module 70b is shown in an installed position with frame retention means in a retaining position 123, and having a display plane 74, and complementary alignment feature 110 positioned to receive said alignment feature 100 of first flexible display module 70a. A display module may be characterized as being installed onto the support frame when its magnetic couplers have engaged a portion of planar support body 44 and its frame retention means is disposed in a retaining position. A plurality of display modules that have been installed onto a planar support body collectively create a viewing plane in which the plurality of display modules produce a uniform tiling of a portion of the viewing plane having no noticeable gaps or overlaps between adjacent display modules. Second flexible display module 70b is shown in an installed position in FIG. 3A, FIG. 3B and FIG. 3C.

Continuing with FIG. 3A, alignment feature 100 of first flexible display module 70a may be caused to partially engage with complementary alignment feature 110 of second flexible display module 70b when flexible display module 70a is disposed at a first angle with respect to adjacent display module that has already been installed onto the planar support body 44. First flexible display module 70a may then be moved so it is disposed according to FIG. 3B, in which one or more magnetic couplers 90 have engaged a portion of planar support body 44. While first flexible display module 70a transitions to an installed position, alignment feature 100 of first flexible display module 70a may become operatively engaged with complementary alignment feature 110 of second flexible display module 70b. When an alignment feature and a complementary alignment feature are operatively engaged, the position and/or orientation of the display plane of first flexible display module 70a may be constrained to the position and/or alignment of the display plane of second flexible display module 70b. Operative engagement of alignment and complementary alignment features may constrain adjacent display planes of adjacent display modules in a variety of ways with respect to both position and orientation. The x-axis, y-axis, z-axis, and the angle of the display plane with respect to each of x-axis, y-axis, and z-axis, may individually or in combination be constrained by one or more pairs of alignment and complementary alignment features. In preferred embodiments, operative engagement of alignment feature of a display module with complementary alignment feature of adjacent display module operates to create a pixel gap between adjacent light emitting elements between adjacent display modules that is substantially equal to the pixel gap between light emitting elements within a single display module. Substantially equal in the foregoing description means equal enough to avoid perceivable visual aberration between adjacent display modules.

FIG. 3C shows the apparatus of FIG. 3B in which frame retention means of first flexible display module 70a has been actuated into a frame retaining position 123. Preferred embodiments of frame retention means provide a durable and removeable clamping action to engage planar support body 44. It can be seen that the steps shown in FIG. 3a, FIG. 3B, and FIG. 3C can performed in sequence to install a display module, and that the sequence can be performed in a reversed order to remove a display module. The frame retention means may be operated by a person from the display plane side of the display module or from the back side of the flexible display module, thereby facilitating both installation and removal from either side of the flexible display module. Preferred embodiments of frame retention means provide a spring member creating a compliant clamping force, effective for retaining the display module despite environmental fluctuations of temperature and humidity. While frame retention means is in retaining position 123, alignment feature 100 and complementary alignment feature are urged to stay operatively engaged. The frame retention means on each display module may provide a secure but compliant attachment to the planar support body 44, thereby allowing the pairs of complementary alignment features to determine the orientation and position of the plurality of display planes with respect to each other while, at the same time, the plurality of display modules are free enough with respect to support planar support body 44 to accommodate such environmental factors as curvature of the support frame, non-uniformity of the support frame, and mechanical and dimensional changes to the support frame caused by vibration, aging, and thermal effects.

The frame retention means on each display module may provide a secure but compliant attachment to the planar support body 44, thereby allowing the pairs of complementary alignment features to determine the orientation and position of the plurality of display planes with respect to each other while, at the same time, the plurality of display modules are free enough with respect to planar support body 44 to accommodate such environmental factors as curvature of the support frame, non-uniformity of the support frame, and mechanical and dimensional changes to the support frame caused by vibration, aging, and thermal effects.

With continuing reference to FIG. 3A-3C, it is noted that some embodiments may use only magnetic couplers to attach flexible display modules to a planar support body, other embodiments may use only mechanical frame retention means to attach flexible display modules to a planar support body, and yet other embodiments may use both magnetic couplers and mechanical frame retention means to attach flexible display modules to a planar support body.

Figure 4:
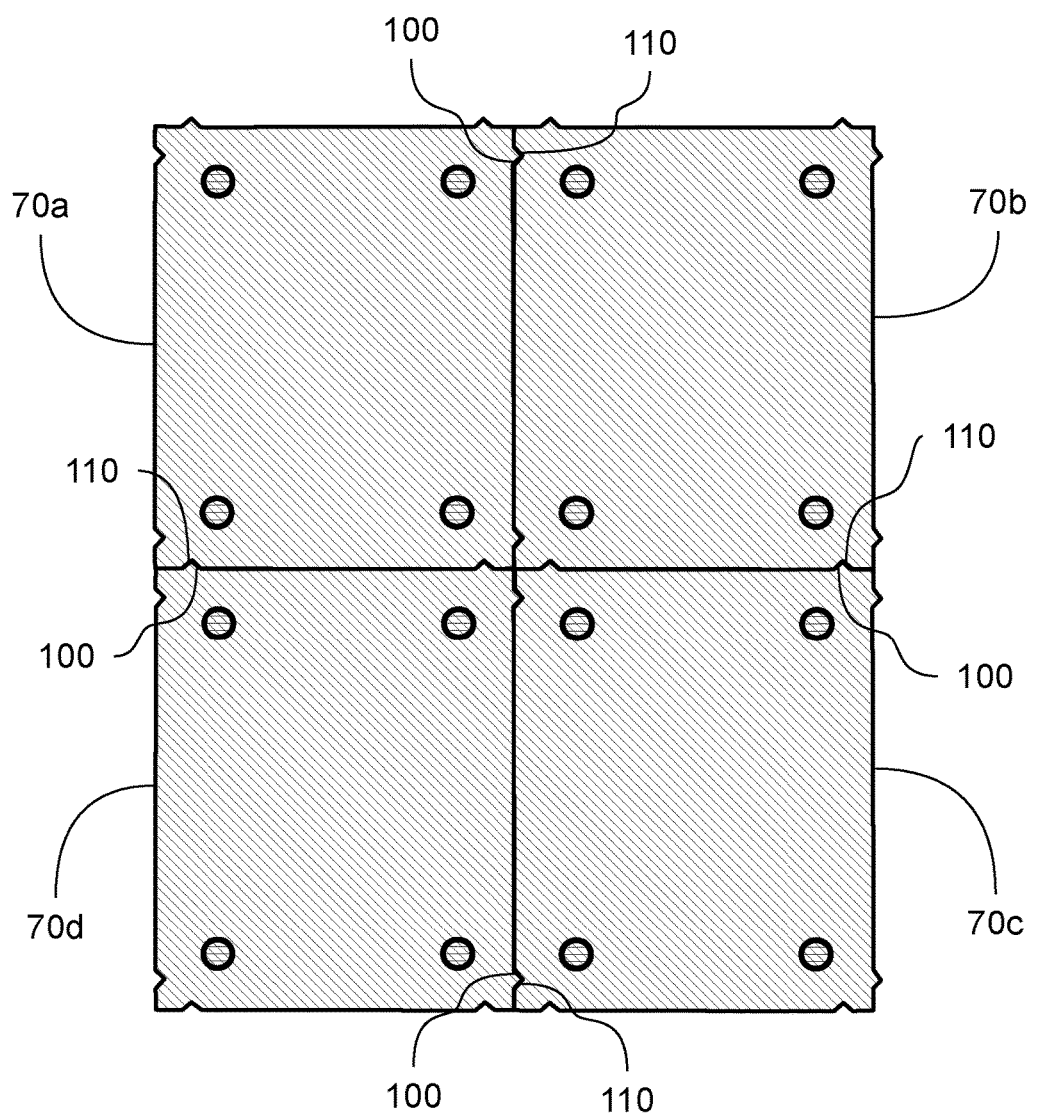
FIG. 4 shows a schematic cross sectional view of a plurality of display modules in which more than one pair of complementary alignment features are simultaneously operatively engaged.

Turning to FIG. 4, shown is a schematic cross sectional view of another embodiment according to the present disclosure in which each of first flexible display module 70a, second flexible display module 70b, third flexible display module 70c, and fourth flexible display module 70d has a plurality of alignment and complementary alignment features. In the modules shown in FIG. 4, each flexible display module has first, second, third, and fourth alignment features as well as first, second, third, and fourth complementary alignment features. According to FIG. 4, when alignment features and a complementary alignment features are operatively engaged between adjacent flexible display modules, the position and/or orientation of the display plane of each flexible display module may be constrained to the position and/or alignment of the display plane of one or more adjacent display modules. Different alignment and complementary alignment features may be simultaneously operatively engaged thereby urging the alignment of the display planes of every adjacent display module.

Figure 5A:
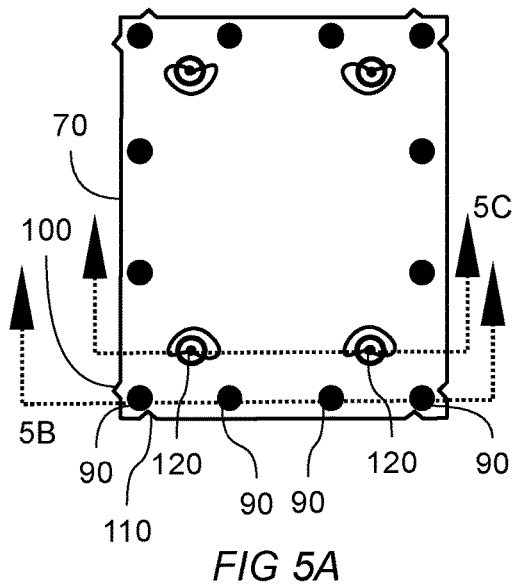
FIG. 5A shows an elevation view of the back of a display module according to an embodiment of the present disclosure. Location and direction of cross section views 5B and 5C are shown.

FIG. 5A shows a view of the back side of a flexible display module 70 according to an embodiment of the disclosure. Visible are one or more alignment features 100, one or more complementary alignment features 110, a plurality of magnetic couplers 90, and a plurality of frame retention means 120. Shown also are dotted lines indicating the location and direction of cross sectional views FIG. 5B and FIG. 5C.

Figure 5B:
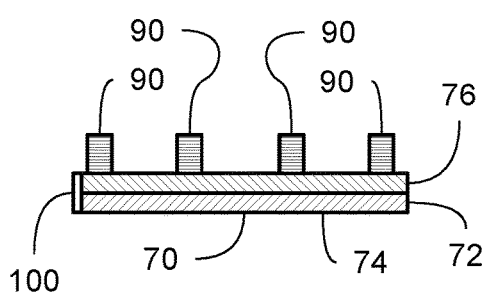
FIG. 5B is a cross sectional view of a display module, consistent with the section indicated in FIG. 5A, showing magnetic coupler and frame retention means for securing a display module to a support frame.
Figure 5C:
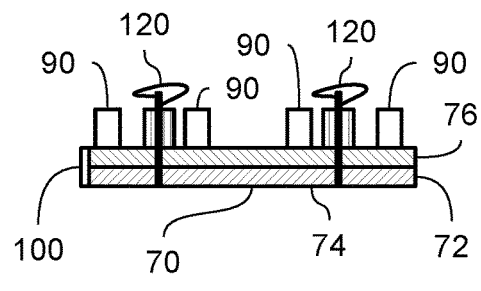
FIG. 5C is a cross sectional view, viewed in the same direction as the view of FIG. 5B, of another embodiment of a flexible display module.

The cross sectional view according to FIG. 5C shows flexible display module 70 comprising: a plurality of light emitting elements 72 coupled to a flexible substrate 76 and disposed in a predetermined pattern to create a display plane 74; a plurality of magnetic couplers 90 coupled to flexible substrate 76, an alignment feature 100 also coupled to the flexible substrate in a predetermined position. The plurality of magnetic couplers 90 may cooperate with with the plurality of frame retention means to establish a consistent offset distance between a planar support body and display plane 74 when flexible display module 70 is installed on a planar support body and frame retention means 120 is operated into the retaining position. It is noted that frame retention means may be operated from the display side of the display module or from the back side of the display module.

The cross sectional view according to FIG. 5B shows the plurality of magnetic couplers 90 enabling secure attachment to a planar support body. Flexible display module 70 may comprise a plurality of light emitting elements 72 coupled to flexible substrate 76 and disposed in a predetermined pattern to create a display plane 74. Visible in FIG. 5B is an alignment feature 100, similar to previously described alignment features. The plurality of magnetic couplers 90 may cooperate with with the plurality of frame retention means to establish a consistent offset distance between a support frame and display plane 74 when flexible display module 70 is installed on a support frame and frame retention means 120 is operated into the retaining position. It is noted that frame retention means may be operated from the display side of the display module or from the back side of the display module.

Figure 6A:
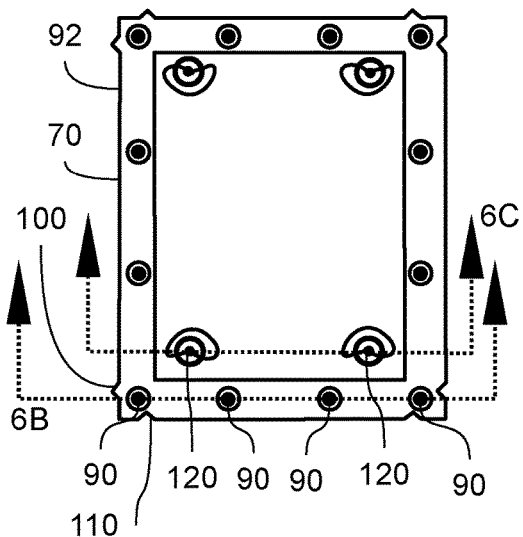
FIG. 6A shows an elevation view of the back of a display module according to another embodiment of the present disclosure. Location and direction of cross section views 6B and 6C are shown.
Figure 6B:
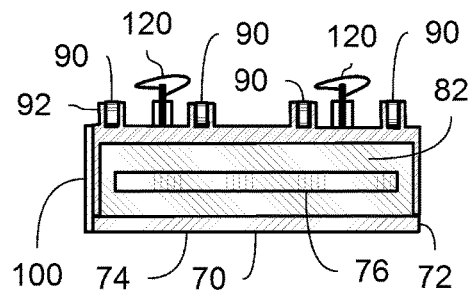
FIG. 6B is a cross sectional view of a display module, consistent with the section indicated in FIG. 6A.
Figure 6C:
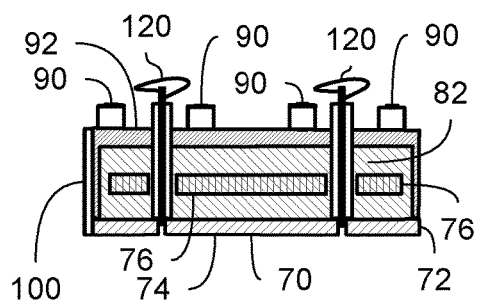
FIG. 6C is a cross sectional view of a display module, consistent with the section indicated in FIG. 6A.

Turning now to FIG. 6A, FIG. 6B, and FIG. 6C, shown is an embodiment of a flexible display module 70 suitable for use in places where protection from the environment is desired. FIG. 6A shows the back side a flexible display module while FIGS. 6B and 6C are the cross sectional views as indicated in FIG. 6A. The flexible display module 70 is shown comprising: flexible substrate 76 surrounded by environmental barrier coating 82, flexible substrate 76 being electrically connected to a plurality of light emitting elements 72 disposed in a predetermined pattern to create display plane 74; one or more alignment features 100 formed at the periphery of the flexible display module; one or more complementary alignment features 110 formed at the periphery of the flexible display; one or more frame retention means 120 operative to releaseably engage a support frame; and a plurality of magnetic couplers 90 coupled in a predetermined position with respect to said display plane 74 by means of coupler alignment frame 92. A portion of coupler alignment frame 92 in close proximity to one or more magnetic couplers may be ferromagnetic and may thereby increase the area of magnetic attraction available to attract the the display module to a ferromagnetic support frame.

In certain preferred embodiments the environmental barrier coating 82 may be a conformal coating operative to substantially seal out liquid and vapor infiltrations from said flexible substrate and any electrical or mechanical components coupled in close proximity to said flexible substrate 76. In other preferred embodiments, environmental barrier coating 82 may be a composite of more than one coating layers. A thin layer of one coating type may be employed in intimate contact with said flexible substrate while a more pliable and thicker coating of the same or a different material may applied over top of the first coating. A variety of coating materials may be employed as part of a single layer or multilayered composite environmental barrier coating including, but not limited to: acrylic, epoxy, urethane, and silicone materials. In addition, the coupler alignment frame is configured to allow the display module to flex in both concave and convex configurations.

Figure 7:
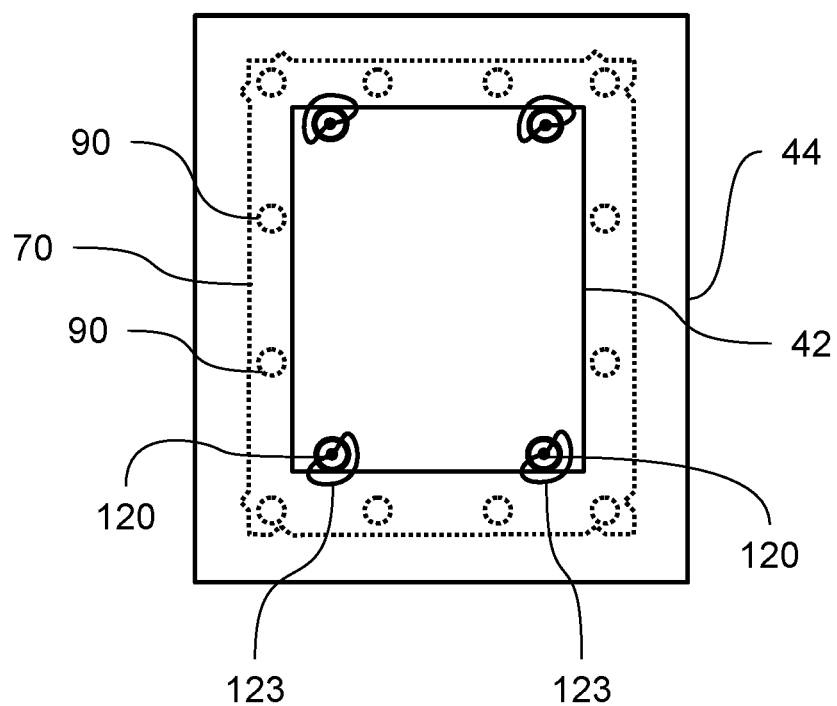
FIG. 7 is an elevation view from the back of a support frame showing a display module installed on the support frame shown with a plurality of frame retention means in an installed position.

FIG. 7 is a view from the back side of planar support body 44 of a flexible display module 70 installed proximate to a support frame aperture 42. In the figure, a plurality of frame retention means 120 are shown in the retaining position 123. Also in the figure a plurality of magnetic frame couplers are visible in dotted outline coupling flexible display module 70, also shown in dotted outline, to said planar support body 44. The components shown in dotted outline are shown that way because they are not directly visible from this viewpoint behind planar support body 44 when the display module is installed on planar support body 44.

Figure 8A:
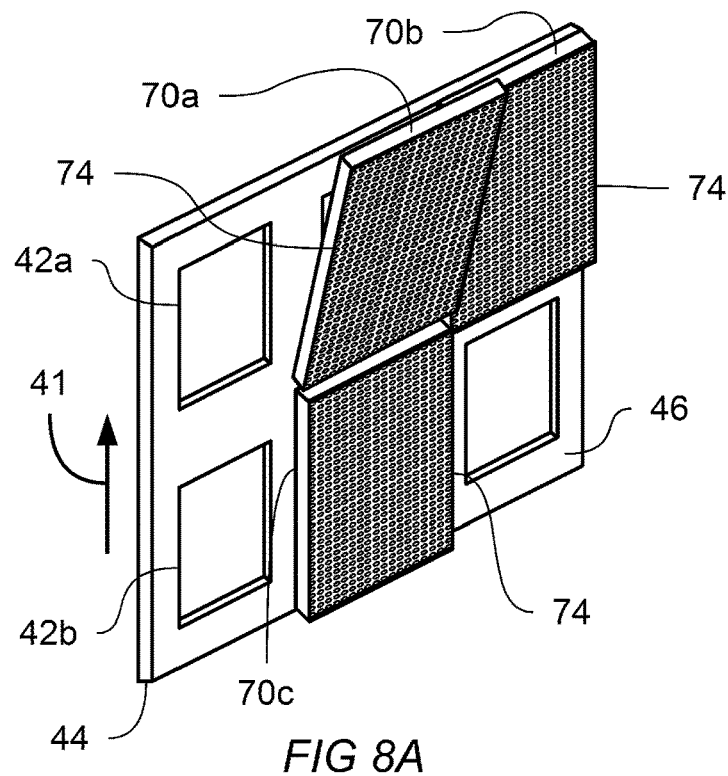
FIG. 8A shows a perspective view of a system of display modules on a support frame. One display module is shown in the midst of being either installed or removed.
Figure 8B:
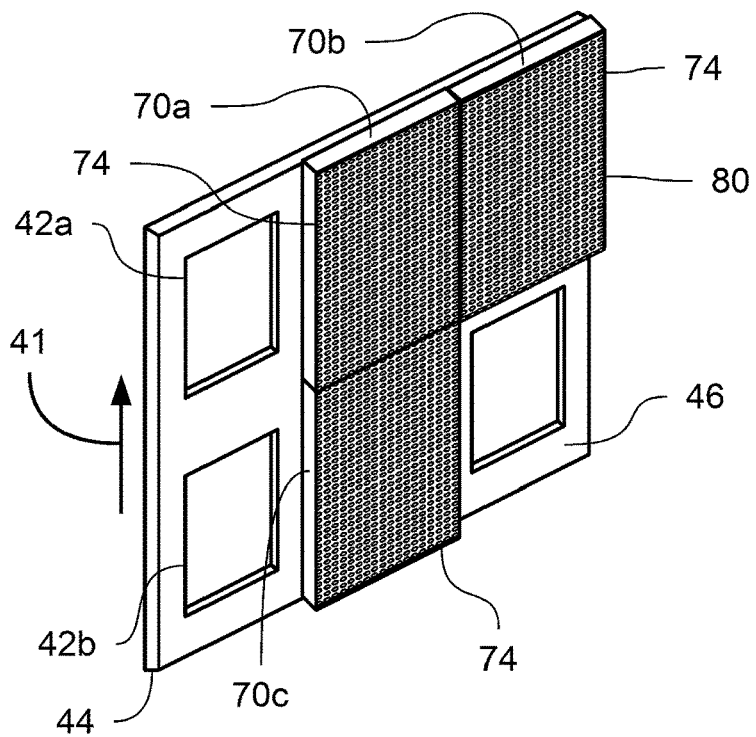
FIG. 8B shows a perspective view of a system of display modules installed on a support frame. Three installed modules are shown collectively creating a viewing plane.

FIG. 8A and FIG. 8B show perspective views of a system of display modules, installed on a planar support body 44, consistent with the display modules described previously, however, the drawing is simplified for clarity. First flexible display module 70a of FIG. 8A is shown with display plane 74 tilted at angle with respect to the collectively established viewing plane of the previously installed display modules, second flexible display module 70b and third display module 70c. When first flexible display module 70a is moved to an installed position, alignment and complementary alignment features are moved to become operatively engaged for establishing and maintaining alignment between the display planes of adjacent modules. FIG. 4 and FIG. 8A and FIG. 8B show, in combination, that multiple pairs of complementary alignment features may be made to operatively engage as the display plane of a display module is moved from being at an angle with respect to the viewing plane to an angle that is coincident with the viewing plane. The display planes of first, second, and third flexible display modules, 70a, 70b, and 70c, respectively, are urged to remain aligned and substantially co-planar by means of the action of multiple alignment features. Substantially co-planar in the foregoing description means a degree of co-planarity that is sufficient to avoid perceivable visual aberration, when viewed at a typical viewing distance, between adjacent display modules.

FIG. 8A and FIG. 8B show additional features of the present disclosure that address the needs of mounting, assembling, and servicing of large visual displays that are created by tiling one or more display modules onto an underlying modular support frame structure. FIG. 8A shows a perspective view of the front of a planar support body 44 according to an embodiment of the present disclosure. Thin planar support body 44 is shown comprising a display mounting face 46 that is suitable for mounting display modules of the present disclosure, and having one or more support frame apertures 42*a* and 42*b*. Planar support body 44 is configured to support the weight of tiled display modules along the direction defined by support direction 41 and is furthermore able to curve in directions transverse to the support direction.

Figure 9A:
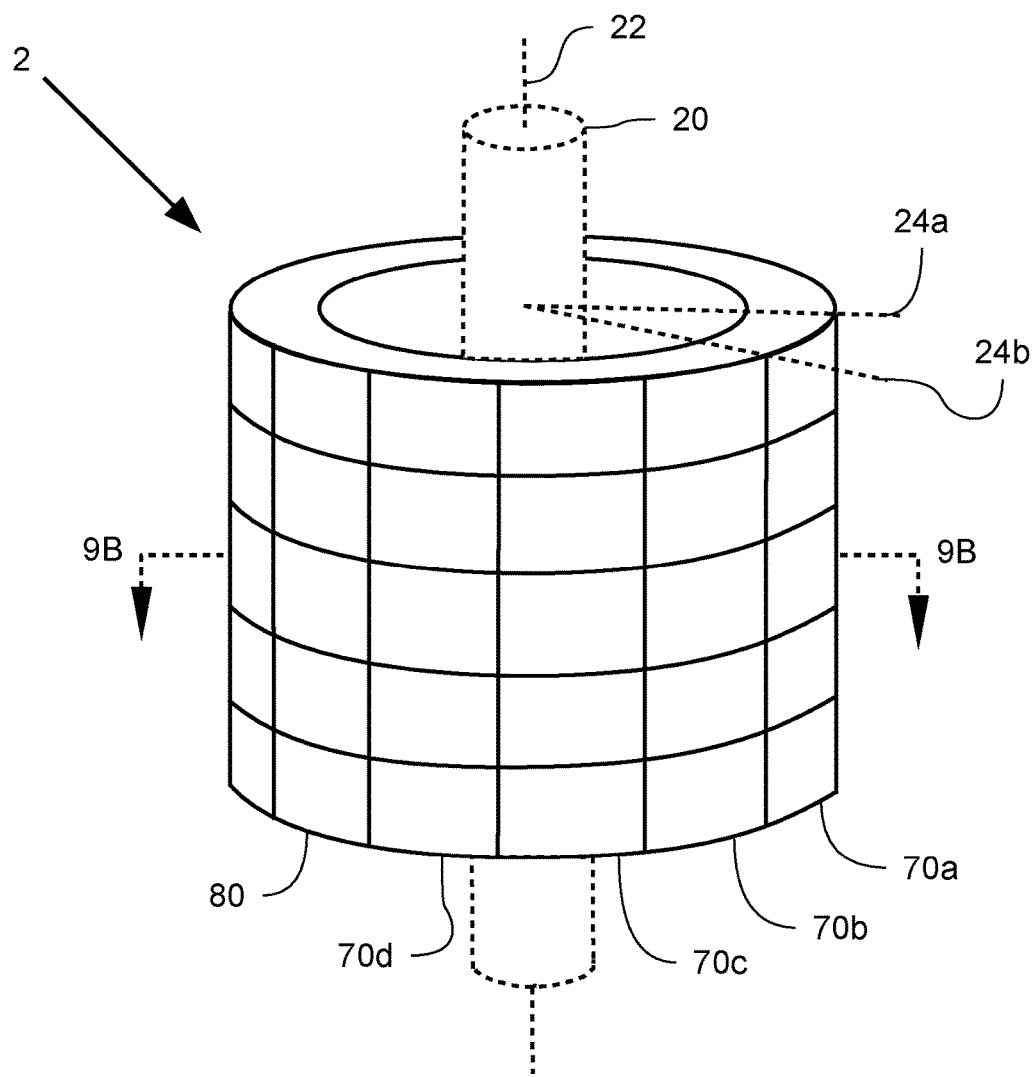
FIG. 9A shows a perspective view of a modular flexible convex display system. Cross-section indicated as 9B is shown in FIG. 9B.
Figure 9B:
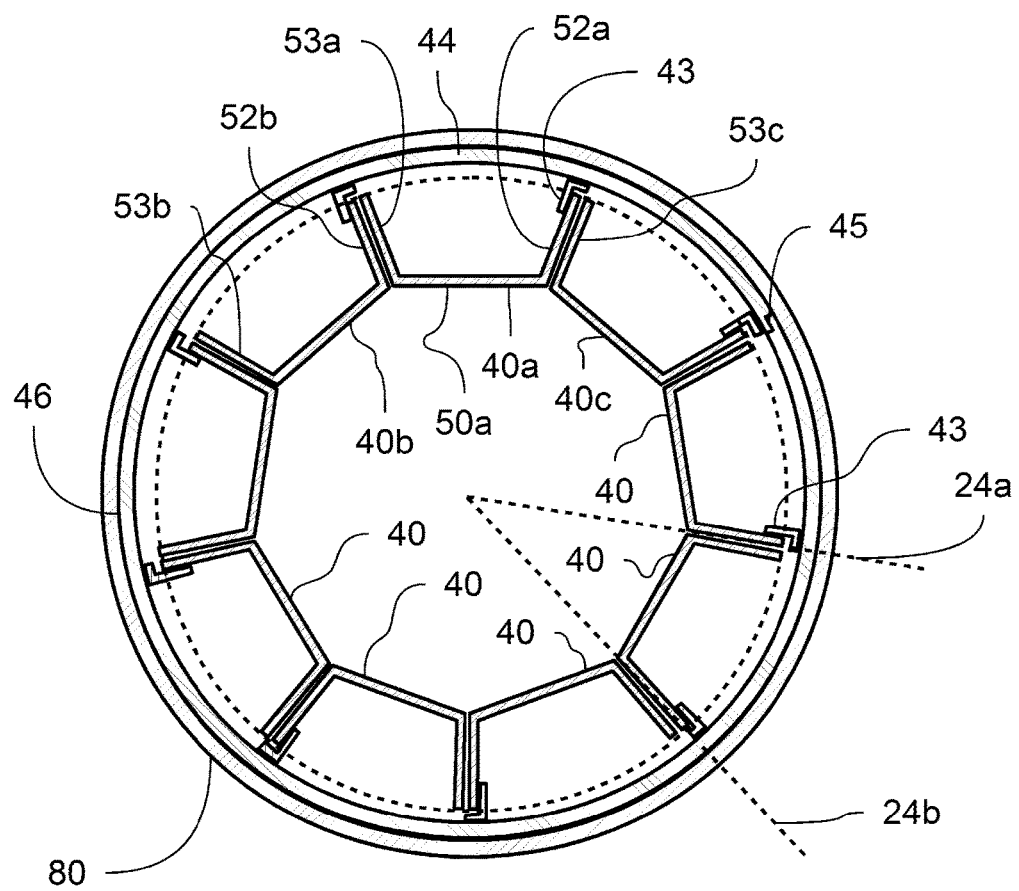
FIG. 9B shows the top down cross sectional view of the system of FIG. 9A.

Turning now to FIG. 9A, shown is a perspective view of a modular flexible convex display system 2. The top down cross-sectional view indicated as 9B is shown in FIG. 9B. Structural member 20, axial reference line 22, and radial reference lines 24*a* and 24*b* are shown in dotted lines as part of the typical environment in which the system may be installed and used, but they themselves don't form a tangible part of the embodiment. The modular flexible convex display system 2 is shown comprising a plurality of display modules arranged to abut a plurality of adjacent display modules such that viewing plane 80 is created to encircle axial reference line 22, the viewing plane 80 being visible on the outermost portion of the system shown.

The system of FIG. 9A is shown comprising a plurality of display modules arranged to create a three dimensional cylindrical shaped viewing plane 80. The plurality of display modules includes first display module 70*a*, second display module 70*b*, third display module 70*c*, and, fourth display module 70*d*. The plurality of display modules may be constructed via any of the previously disclosed methods of constructing flexible display modules. The plurality of display modules are disposed with respect to each other such that no visible gaps or overlaps are visible. Not shown in FIG. 9A is an underlying support system and/or structure to which the plurality of display modules are attached and/or coupled. Exemplary support systems and structures are detailed in further figures of the disclosure. It is noted that the outermost shape of the system is not confined to being circular, many variations of convex enclosed shape are possible within the spirit and scope of the disclosure.

FIG. 9B shows the top down cross sectional view of the system of FIG. 9A. The outermost portion shows that the viewing plane 80, provided by the plurality of display modules of FIG. 9A, is visible on the outside of the the system. The cross section of FIG. 9B shows some of the support structure of the system. A plurality of modular support frames 40 are shown coupled together enclosing a central volume. Coupled to the plurality of modular support frames 40 are radially adjustable couplers 43, which are coupled between one or more modular support frames and thin planar support body 44. It can be seen from geometric considerations that when a radially adjustable coupler 43 is adjusted radially outward along the direction of radial reference line 24*a*, that the length of a perimeter encompassed by planar support body 44 is increased. Likewise, it can be seen from geometric considerations that when a radially adjustable coupler 43 is adjusted radially inward along the direction of radial reference line 24*b*, that the length of a perimeter encompassed by planar support body 44 is decreased. In the figure the perimeter encompassed by planar support body 44 coincides with display mounting face 46. Display modules are tiled onto display mounting face 46 and thereby create viewing plane 80. In preferred embodiments, radial adjustments to one or more radially adjustable couplers 43, may be made until the perimeter length of mounting face 46 is substantially an integer multiple of the length of one of the sides of the display module. A viewing plane 80 with no visible gaps or overlaps may thereby be created. A planar support body lap joint 45 may be used where opposing edges of planar support body 44 meet.

FIG. 9B shows a plurality of rigid modular support frames 40, each being coupled to one or more adjacent modular support frames. In the figure first modular support structure 40*a* is shown comprising a back panel 50*a*, a right side panel 52*a*, and a left side panel 53*a*. Shown in dotted outline is the outline of a bottom panel, directly visible in in FIG. 11 along with a top panel. In the figure, left side panel 53*a* of first modular support frame 40*a* is shown abutting and rigidly coupled to right side panel 52*b* of second modular support frame 40*b*, while right side panel 52*a* of first modular support frame 40*a* is showing abutting and rigidly coupled to left side panel 53*c* of third modular support frame 40*c*. The plurality of modular support frames is substantially similar or identical.

Figure 10:
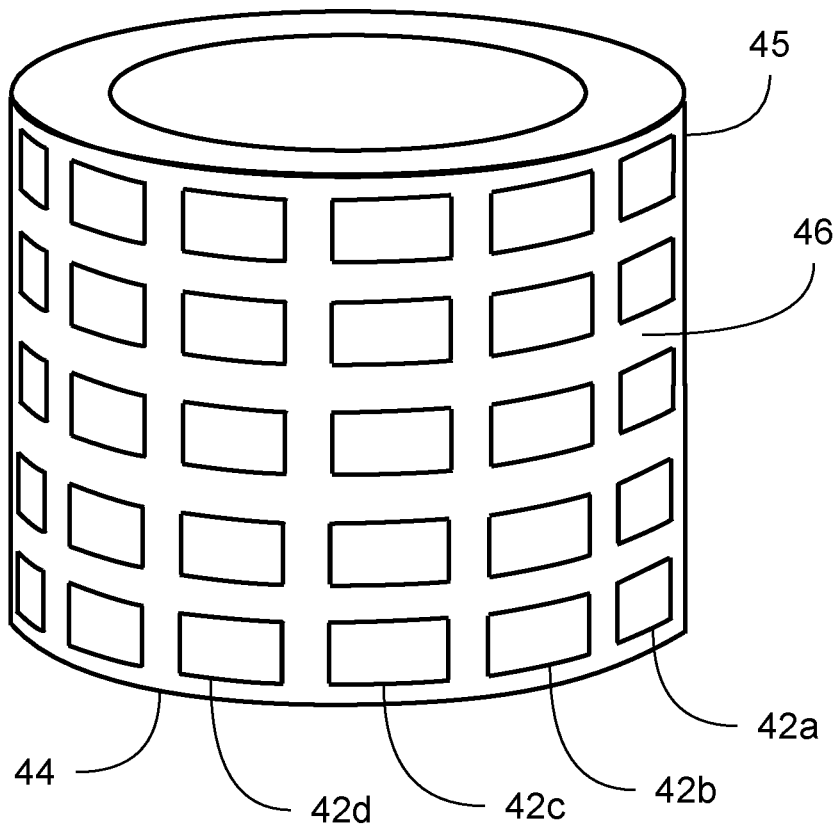
FIG. 10 is a perspective view of the system of FIG. 9A with the plurality of display modules removed and thereby showing the display mounting face of the planar support body and a plurality of support frame apertures.

Turning now to FIG. 10, shown is a perspective view of the system of FIG. 9A with the plurality of display modules removed and thereby showing the display mounting face 46 of the planar support body 44 and a plurality of support frame apertures, 42*a*, 42*b*, 42*c*, and 42*d*. Planar support body lap joint 45 may run along the entire length of one side of planar support body 44.

Figure 11:
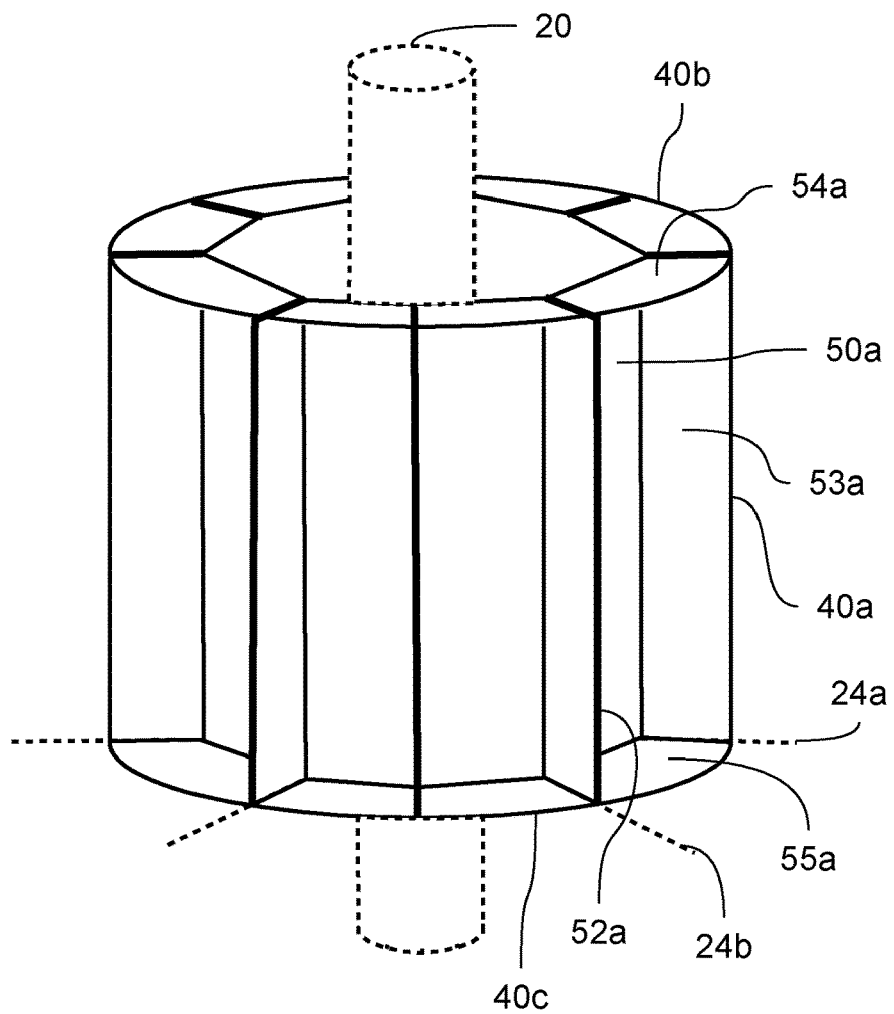
FIG. 11 is a perspective view of the system of FIG. 10 with the planar support body removed and thereby showing a plurality of modular support frames assembled into a support frame structure.

FIG. 11 is a perspective view of the system of FIG. 10 with the planar support body removed and thereby showing a plurality of modular support frames 40 assembled into a composite support frame structure. First modular support frame 40*a* is shown abutting and rigidly coupled to both second modular support frame 40*b* and third modular support frame 40*c*. First modular support frame 40*a* is shown comprising thin elongate back panel 50*a* joined to top panel 54*a*, bottom panel 55*a*, right side panel 52*a*, and left side panel 53*a*. Left side panel 53*a* is shown to be oriented along a first radial reference line 24*a*, while right side panel 52*a* is shown to be oriented along a second radial reference line 24*b*. Left side panel and right side panel are not parallel to each other. Support column 20 is shown in dotted line to indicate that it is not part of the embodiment, but, is included in the figure to give some idea of the environment in which the embodiment shown may be used.

The disclosed support frames and display modules may be used in a number of installation environments. One typical installation environment for a large convex display system is around a rigid architectural structure like a beam or column which may provide a mounting surface onto which the system of support frames may be mounted. Accordingly, in some embodiments of the present disclosure, a system of modular support frames may be assembled thereby providing a substructure for attaching display modules so as to provide a convex viewing plane that encloses a column or beam. According to other embodiments of the the disclosure free standing display systems may be constructed. According to other embodiments of the the disclosure, suspended display systems may be constructed. According to other embodiments of the the disclosure, display systems may be constructed that partially enclose an axial reference line.

In addition to installation environments that result in a substantially convex viewing plane, other installation environments may require adapting the curvature of the viewing plane to convex, concave, and/or multiple curvature containing shapes that may each have their own appeal and challenges. Accordingly, embodiments of the present disclosure describe a system of modular support frames that may be assembled to provide a substructure for attaching display modules that presents a non-flat viewing plane having convex, concave, or multiple curvatures. One or more display modules may be individually installed, serviced, and removed from the system of support frames without substantially disturbing adjacent display modules.

In order to deploy a large modular display system, a variety of support equipment may be needed beyond the display modules and modular support frames already described. In particular, a plurality of power supplies and a plurality of display control units may be used to power display modules and to supply image data to the plurality of display modules comprising the viewing plane. It may be convenient to co-locate with a modular support frame a power supply that can satisfy the power requirements of all of the display modules installed onto that modular support frame. Likewise, it may be convenient to co-locate with a modular support frame one or more display control units that can satisfy the data driving requirements of all of the display modules installed onto that modular support frame. This modular approach can be achieved by means of one or more equipment mounts, each rigidly coupled a modular support frame. Attaching equipment mount directly to a modular support frame allows the weight of any mounted equipment to be transmitted into the support structure thereby preventing the attached weight from substantially affecting the ability of a planar support body to curve smoothly in directions transverse to the support direction. More than one mount may be used to mount the desired amount of equipment.

By means of the previously described systems and methods, a fully modular system can be deployed in which flexible display modules may be tiled onto a support frame system, according to previously described methods, making use of one or more modular support frames, one or more planar support bodies each having one or more support frame apertures. Operatively engaged alignment and complementary alignment features of adjacent display modules ensure that the plurality of tiled display modules collectively provide a viewing plane without visual aberrations. Flexible environmental barrier coatings may be employed to provide resistance to liquid and vapor infiltration while permitting the display modules to be installed in a variety of environments including convex curved installations.

Although the present invention has been described in considerable detail with reference to certain preferred versions thereof, other versions are possible. It may be desirable to combine features shown in various embodiments into a single embodiment. A different number and configuration of features may be used to construct embodiments of the apparatus and systems that are entirely within the spirit and scope of the present disclosure. Therefor, the spirit and scope of the appended claims should not be limited to the description of the preferred versions contained herein.

Any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

We claim:

1. A method of constructing a display system, the method comprising the steps of:
    a) mounting a plurality of display modules on a display mounting face of a planar support body;
    b) each of said plurality of display modules constructed by a method comprising the steps of:
        i) coupling a plurality of light emitting elements to a substrate;
        ii) disposing said plurality of light emitting elements in a predetermined pattern thereby creating a display plane;
        iii) defining a pitch distance between adjacent light emitting elements of said plurality of light emitting elements;
        iv) configuring said predetermined pattern so that said pitch distance is uniform across said display plane;
    c) configuring said planar support body to support the weight of said plurality of display modules along a support direction;
    d) configuring said planar support body so that at least a portion of the display mounting face is configured into a curved shape in a direction transverse to said support direction;
    e) coupling a plurality of adjustable couplers between said planar support body and a support frame, each adjustable coupler being operative to adjust a spacing between said planar support body and said support frame, at least one adjustable coupler operable to change a radius of curvature of said curved shape;
    f) forming the display planes of said plurality of display modules into a viewing plane;
    g) configuring at least one of the plurality of adjustable couplers so that the viewing plane has no visible gaps or overlaps between adjacent display modules.

2. The method of claim 1 further comprising the steps of:
    a) configuring the plurality of display modules so that the viewing plane encompasses a central volume, the viewing plane being visible from the outside of said central volume.

3. The method of claim 1 further comprising the steps of:
    a) configuring the planar support body so that two opposite edges of the planar support body overlap at an adjustable lap joint, the planar support body encompassing a central volume;
    b) adjusting one or more of said adjustable couplers to change the amount of overlap present at said lap joint.

4. The method of claim 1 further comprising the steps of:
    a) incorporating a plurality of ferromagnetic portions into the planar support body;
    b) the method of constructing each display module additionally comprising the step of: coupling to the display module a magnetic retention means having a retaining position and a non-retaining position, the retaining position characterized in that the display module is releasably coupled to said planar support body about one of said ferromagnetic portions and the display plane of the display module conforms to the curvature of the planar support body, and, the non-retaining position characterized in that the display module is removeable from said planar support body.

5. A method of constructing a display system, the method comprising the steps of:
    a) mounting a plurality of display modules on a support body comprising a plurality of apertures, each of said display modules being mounted about one of said plurality of apertures;
    b) configuring said support body to support the weight of said plurality of display modules along a support direction;
    c) configuring at least a portion of said support body into a curved shape in a direction transverse to said support direction;
    d) each of said plurality of display modules constructed by a method comprising the steps of:

i) coupling a plurality of light emitting elements to a substrate;
ii) disposing said plurality of light emitting elements in a predetermined pattern thereby creating a display plane;
iii) defining a pitch distance between adjacent light emitting elements of said plurality of light emitting elements;
iv) configuring said predetermined pattern so that said pitch distance is uniform across said display plane;
e) coupling a plurality of adjustable couplers between said support body and a support frame, each adjustable coupler being operative to adjust a spacing between said support body and said support frame, at least one adjustable coupler operable to change a radius of curvature of said curved shape;
f) forming the display planes of said plurality of display modules into a viewing plane;
g) configuring at least one of the plurality of adjustable couplers so that the viewing plane has no visible gaps or overlaps between adjacent display modules.

6. The method of claim 5 further comprising the steps of:
a) configuring the plurality of display modules so that the viewing plane encompasss a central volume, the viewing plane being visible from the outside of said central volume.

7. The method of claim 5 further comprising the steps of:
a) configuring the support body so that two opposite edges of the support body overlap at an adjustable lap joint, the support body encircling a central volume;
b) adjusting one or more of said adjustable couplers to change the amount of overlap present at said lap joint.

8. The method of claim 5 further comprising the steps of:
a) incorporating a plurality of ferromagnetic portions into the support body;
b) the method of constructing each display module additionally comprising the step of: coupling to the display module a magnetic retention means having a retaining position and a non-retaining position, the retaining position characterized in that the display module is releasably coupled to said support body about one of said ferromagnetic portions and the display plane of the display module conforms to the curvature of the support body, and, the non-retaining position characterized in that the display module is removeable from said support body.

9. A method of constructing a display system, the method comprising the steps of:
a) configuring a plurality of support frames to encompass a central volume;
b) coupling each support frame to at least one adjacent support frame;
c) coupling a plurality of display modules to said plurality of support frames;
d) configuring said plurality of support frames to support the weight of said plurality of display modules along a support direction;
e) configuring at least a portion of said plurality of support frames into a curved shape in a direction transverse to said support direction;
f) each of said plurality of display modules constructed by a method comprising the steps of:
i) coupling a plurality of light emitting elements to a substrate;
ii) disposing said plurality of light emitting elements in a predetermined pattern thereby creating a display plane;
iii) defining a pitch distance between adjacent light emitting elements of said plurality of light emitting elements;
iv) configuring said predetermined pattern so that said pitch distance is uniform across said display plane;
g) coupling a plurality of adjustable couplers between said plurality of support frames and said plurality of display modules, each adjustable coupler being operative to adjust a radius of curvature of the display plane of one of said plurality of display modules;
h) forming the display planes of said plurality of display modules into a viewing plane;
i) configuring at least one of the plurality of adjustable couplers so that the viewing plane has no visible gaps or overlaps between adjacent display modules.

10. The method of claim 9 further characterized in that at least one of the plurality of support frames is constructed by a method comprising the steps of:
a) coupling a top panel to both a left side panel and a right side panel, the top panel abutting both left and right panels;
b) coupling a bottom panel to both said left side panel and said right side panel, the bottom panel abutting both left and right panels;
c) aligning said left side panel with a first radial line extending outward from a point inside of said central volume;
d) aligning said right side panel with a second radial line extending outward from a point inside of said central volume.

11. The method of claim 9 further comprising the steps of:
a) incorporating a plurality of ferromagnetic portions into the plurality of support frames;
b) the method of constructing each display module additionally comprising the step of: coupling to the display module a magnetic retention means having a retaining position and a non-retaining position, the retaining position characterized in that the display module is releasably coupled to one of said plurality of support frames about one of said ferromagnetic portions and the display plane of the display module conforms to the curvature of the support frame to which it is coupled, and, the non-retaining position characterized in that the display module is removeable from said support frame to which it was coupled.

12. The method of claim 9 further comprising the step of configuring at least one of said plurality of adjustable couplers to provide adjustability in a direction parallel to said left side panel.

13. The method of claim 9 further comprising the step of configuring at least one of said plurality of adjustable couplers to provide adjustability in a direction parallel to said right side panel.

14. The method of claim 9 further comprising the step of configuring at least one of said plurality of adjustable couplers to provide adjustability in a direction parallel to said top panel.

15. The method of claim 9 further comprising the step of configuring at least one of said plurality of adjustable couplers to provide adjustability in a direction parallel to said bottom panel.

* * * * *